United States Patent
Gupta et al.

[11] Patent Number: 6,125,861
[45] Date of Patent: Oct. 3, 2000

[54] POST-CMP WET-HF CLEANING STATION

[75] Inventors: Anand Gupta, Phoenix; Chris Karlsrud; Periya Gopalan, both of Chandler; Daniel R. Trojan, Phoenix, all of Ariz.; Jeffrey B. Cunnane, Wheaton, Ill.; Jon R. MacErnie, Chandler, Ariz.

[73] Assignee: SpeedFam-IPEC Corporation, Chandler, Ariz.

[21] Appl. No.: 09/058,647

[22] Filed: Apr. 10, 1998

Related U.S. Application Data

[63] Continuation-in-part of application No. 09/020,979, Feb. 9, 1998, Pat. No. 5,954,888.

[51] Int. Cl.⁷ .................................................. B08B 3/00
[52] U.S. Cl. ............................ 134/61; 134/199; 134/902
[58] Field of Search .......................... 134/902, 61, 64 R, 134/124, 199

[56] References Cited

U.S. PATENT DOCUMENTS

| | | | |
|---|---|---|---|
| 3,868,272 | 2/1975 | Tardoskegyi | 134/26 |
| 3,887,272 | 6/1975 | Weed | 352/130 |
| 4,282,825 | 8/1981 | Nagatomo et al. | 134/902 X |
| 4,417,945 | 11/1983 | Komatsuzaki . | |
| 4,781,205 | 11/1988 | Shakley | 134/131 |
| 4,784,169 | 11/1988 | Striedieck | 134/111 |
| 4,828,878 | 5/1989 | Mankut et al. | 427/98 |
| 4,886,082 | 12/1989 | Kato et al. | 134/60 |
| 5,017,242 | 5/1991 | Anderson | 134/22.18 |
| 5,176,158 | 1/1993 | Ketelhohn et al. | 134/32 R |
| 5,292,373 | 3/1994 | Arita et al. . | |
| 5,306,671 | 4/1994 | Ogawa et al. . | |
| 5,317,778 | 6/1994 | Kudo et al. . | |
| 5,333,628 | 8/1994 | Ogata et al. | 134/64 R |
| 5,335,681 | 8/1994 | Schmid | 134/64 R |
| 5,340,437 | 8/1994 | Erk et al. . | |
| 5,442,828 | 8/1995 | Lutz . | |
| 5,475,889 | 12/1995 | Thrasher et al. . | |
| 5,483,717 | 1/1996 | Chikaki | 15/3 |
| 5,483,984 | 1/1996 | Donlan, Jr. et al. | 134/199 X |
| 5,486,234 | 1/1996 | Contolini et al. . | |
| 5,487,398 | 1/1996 | Ohmi et al. . | |
| 5,494,529 | 2/1996 | Ciccareli et al. | 134/15 |
| 5,500,081 | 3/1996 | Bergman . | |
| 5,518,552 | 5/1996 | Tanoue et al. . | |
| 5,551,986 | 9/1996 | Jain . | |
| 5,568,821 | 10/1996 | Ohmori et al. . | |
| 5,571,367 | 11/1996 | Nakajima et al. . | |
| 5,581,837 | 12/1996 | Uchiyama et al. . | |
| 5,609,719 | 3/1997 | Hempel . | |
| 5,626,159 | 5/1997 | Erk et al. . | |
| 5,626,681 | 5/1997 | Nakano et al. . | |
| 5,639,311 | 6/1997 | Holley et al. . | |
| 5,651,160 | 7/1997 | Yonemizu et al. . | |
| 5,655,954 | 8/1997 | Oishi et al. . | |
| 5,733,171 | 3/1998 | Allen et al. . | |
| 5,766,685 | 6/1998 | Smith et al. | 427/307 |
| 5,836,325 | 11/1998 | Akanuma et al. | 134/183 |
| 5,899,216 | 5/1999 | Goudie et al. | 134/61 |

FOREIGN PATENT DOCUMENTS

| | | |
|---|---|---|
| 08187660 | 7/1996 | European Pat. Off. ........ B24B 51/00 |
| 0 764 478 A1 | 3/1997 | European Pat. Off. . |
| 08309297 | 11/1996 | Japan . |
| WO97/12392 | 4/1997 | WIPO . |
| WO97/13590 | 4/1997 | WIPO . |
| WO 98/01892 | 1/1998 | WIPO ........................... H01L 21/00 |

*Primary Examiner*—Philip R. Coe
*Attorney, Agent, or Firm*—Snell & Wilmer, L.L.P.

[57] ABSTRACT

The present invention provides an apparatus for cleaning semiconductor workpieces following a Chemical Mechanical Planarization ("CMP") procedure. Initially, a workpiece is scrubbed to remove some of the slurry material and other contaminants on the surfaces of the workpiece. Next, the workpiece is transported into a chemical-etch cleaning station wherein the workpiece is positioned horizontally such that both the upper and lower surfaces are substantially exposed. The workpiece then is immersed in a cleaning solution which is moved around the various surfaces of the workpiece. The workpiece is immersed in the cleaning solution for a sufficient length of time to remove an appropriate layer of oxide, thereby removing contaminants and smoothing micro scratches from the surfaces of the workpiece.

13 Claims, 12 Drawing Sheets

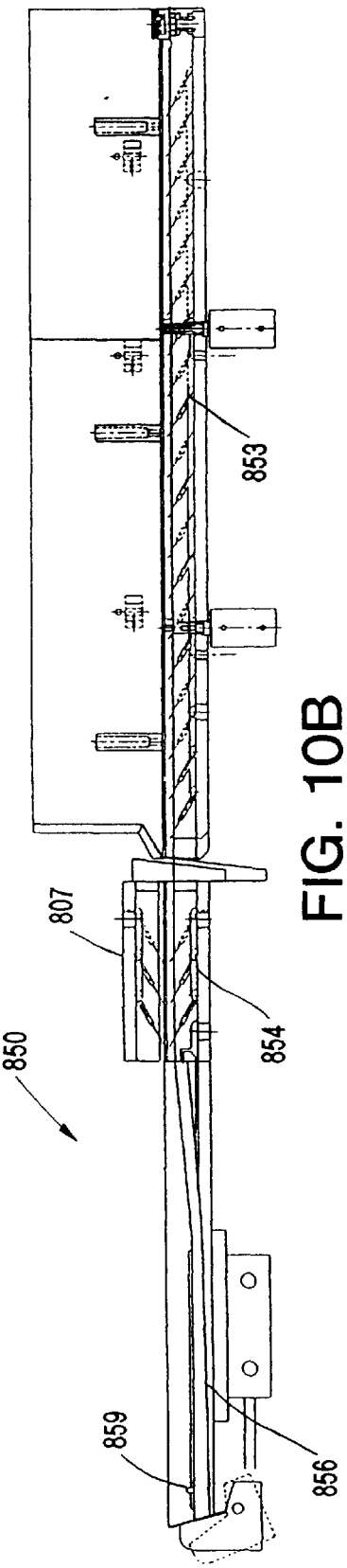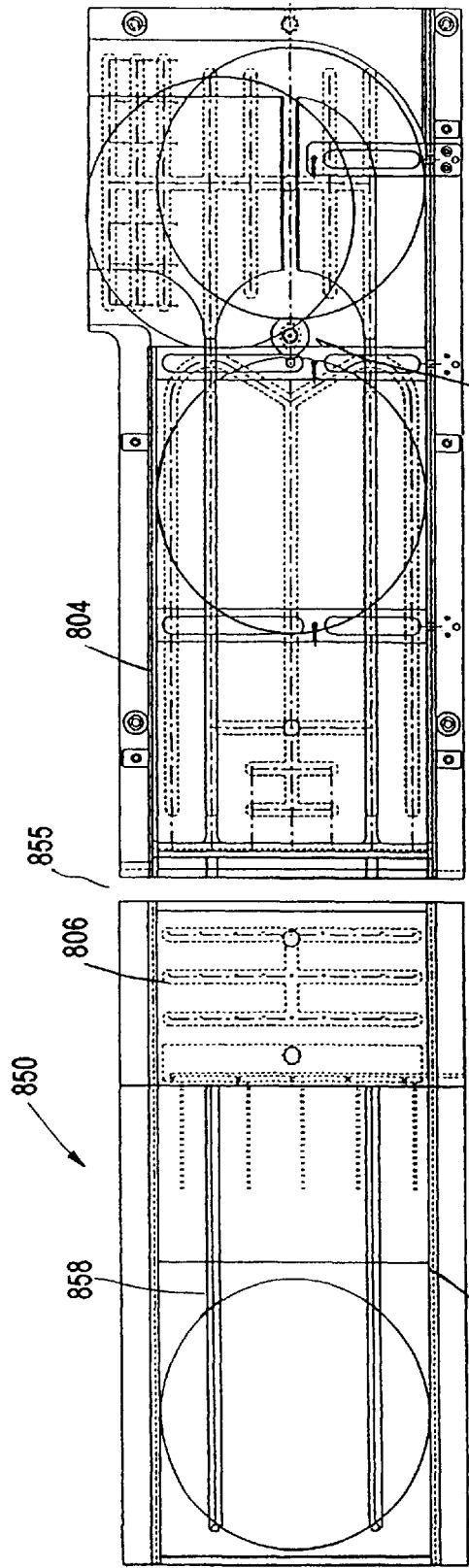
FIG. 10B
FIG. 10A

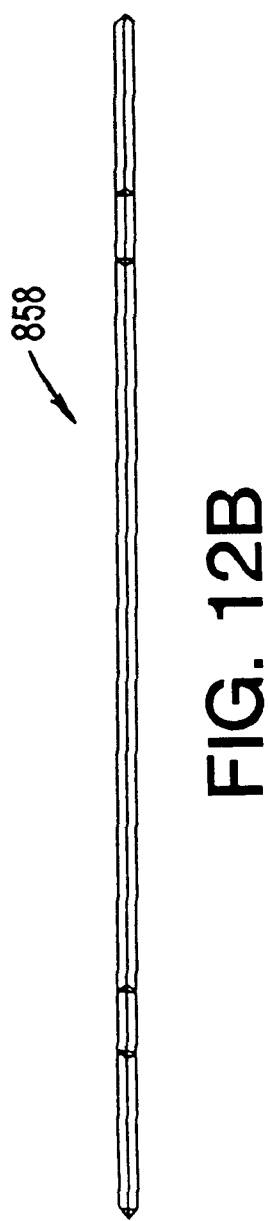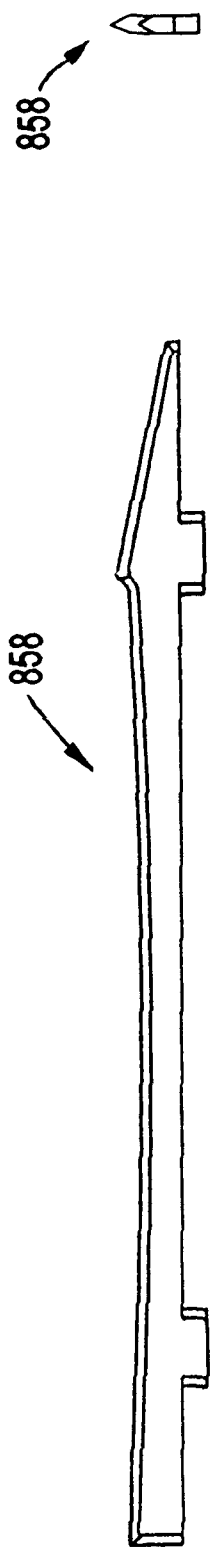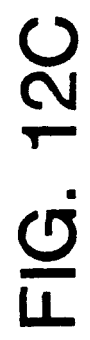
FIG. 12C
FIG. 12B
FIG. 12A

POST-CMP WET-HF CLEANING STATION

STATEMENT OF RELATED APPLICATIONS

This application is a continuation-in-part of U.S. Ser. No. 09/020,979 filed Feb. 9, 1998, and now U.S. Pat. No. 5,954,888.

TECHNICAL FIELD OF THE INVENTION

The present invention relates generally to an apparatus for cleaning semiconductor workpieces such as silicon wafers. More particularly, the present invention relates to a method that employs a wet chemical solution to remove surface contaminants, embedded metallic ions, loose oxide, surface stress, and micro scratches from the surface of workpieces.

BACKGROUND OF THE INVENTION

Removing foreign material from the surface of workpieces is a critical element in the manufacturing of semiconductor devices. The presence of contaminants or foreign material can lead to critical failures or prematurely shortened life spans of these devices.

In manufacturing semiconductor devices, silicon workpieces known as "wafers" are used. Wafers typically have a flat, circular disk-like shape. Wafers are initially sliced from a silicon ingot and, thereafter, undergo multiple masking, etching, and dielectric and conductor deposition processes to create microelectronic structures and circuitry on the wafers. The surface of a wafer undergoing these processes typically must be polished or planarized between processing steps to ensure proper flatness, thus permitting use of photo lithographic processes for building additional dielectric and metallization layers on the wafer surface.

Chemical Mechanical Planarization ("CMP") machines have been developed to polish or planarize silicon wafer surfaces to the flat condition necessary for manufacture of integrated circuit components and the like. CMP processes and machines are known in the art and are described in several U.S. Patents. Examples include U.S. Pat. No. 4,805,348, issued in February 1989, to Arai, et al.; U.S. Pat. No. 4,811,522, issued in March 1989 to Gill; U.S. Pat. No. 5,099,614, issued in March, 1992 to Arai et al.; U.S. Pat. No. 5,329,732, issued in July, 1994 to Karlsrud et al.; U.S. Pat. No. 5,476,890, issued in December 1995 to Masayoshi et al.; U.S. Pat. Nos. 5,498,196 and 5,498,199, both issued in March, 1996 to Karlsrud et al.; and U.S. Pat. No. 5,558,568, issued in September 1996 to Talieh et al.

CMP processing typically requires the introduction of a polishing slurry onto the surface of the wafer as it is mechanically polished on a polishing pad. The slurry typically contains fine abrasive particles such as silica and alumina dispersed in an alkali or acidic medium, and also may incorporate chemical cleaning compositions such as surfactants. Consequently, CMP processing of the wafer may leave contaminants such as leftover slurry particles, unwanted metallic ions (sodium, potassium, iron, chromium, nickel, manganese, zinc, titanium, etc), and micro scratch marks on the surface of the wafer. To remove these surface contaminants, the wafers are typically cleaned in a post-CMP cleaning machine.

In a conventional post-CMP cleaning machine, wafers are scrubbed by a set of scrub brushes using deionized ("DI") water, ammonia, or various other chemical solutions. The wafers also may be cleaned using a megasonic cleaning process whereby the workpieces are subjected to high frequency ultrasonic energy while being immersed in either DI water or ammonium hydroxide. Although scrub cleaning and megasonic cleaning may remove some surface contaminants, they may not remove the surface stress, implanted metallic ions, micro scratch marks, and various other unwanted contaminants or defects which may be contained within the layer of oxide damaged by CMP processing of the wafer.

Alternatively, a suitable cleaning solution such as hydrogen fluoride ("HF") may be used in combination with mechanical action to clean wafers. Although the cleaning solution will remove some of the damaged oxide layer from the wafers, the application of mechanical action in combination with an etching solution may result in introduction of sub microscopic scratches and the possibility for the addition of particles from the means used to apply the mechanical action. Additionally, safety and waste disposal concerns may be further disadvantages of this cleaning method.

Typically, CMP planarization and post-CMP cleaning are performed in independent machines. After the wafers are planarized on a CMP planarization machine, the wafers are transferred to a post-CMP cleaning machine. The time required to transfer the wafers increases the overall processing time and increases the likelihood that contaminants will dry on the surface of the wafers. To help prevent contaminants from drying on the surface of the wafers, the wafers are transported in a wet environment which requires special handling and equipment. Transporting workpieces from one machine to another has the additional disadvantage of increasing the risk of breaking the wafers.

After post-CMP cleaning, a chemical-etch cleaning process may be employed to remove the damaged layer of oxide from the wafers. In a conventional chemical-etch cleaning process, wafers are placed vertically into a static bath of chemical solution such as HF solution. This method, however, has several short-comings. For example, the HF solution gradually degrades as the cleaning operation is repeated, thus making it difficult to control the amount of oxide layer removed from the wafers. Additionally, the recirculated HF solution may incorporate additional particles on the surface of the wafers. Air bubbles adhering to the surface of the wafers as they are placed into the HF solution also may result in nonuniform etching of the wafers. Further, the reaction of silicon oxide with HF results in the formation of silicon fluoride and water molecules. Both the silicon fluoride and water molecules tend to stay at the interface between the wafer surface and the HF solution, which may result in low etch rate and nonuniform etching of the wafers. More particularly, the water remaining at the interface will dilute the concentration of the HF at the wafer surface, thus resulting in etch nonuniformity and lower etch rates.

Typically, chemical-etch cleaning of wafers is performed on special wet benches designed to handle hazardous chemicals. After the wafers are cleaned in a post-CMP cleaning machine, the wafers are transported to a chemical-etch cleaning machine. Transporting the wafers from one machine to another again increases the overall processing time, the likelihood that contaminants will dry on the surface of the wafers, and the risk of breakage. Therefore, a need exists for an apparatus to remove contaminants and damaged oxide layers from the surface of workpieces which overcomes the various short-comings associated with existing conventional methods.

SUMMARY OF THE INVENTION

The present invention relates to an apparatus for removing loose oxide, surface stress, metallic ions, contaminants and micro scratches from the surface of workpieces following CMP planarization and post-CMP cleaning. This is accomplished by removing the damaged layer of oxide from the surface of the workpieces after the workpieces have been polished and/or planarized and post-CMP cleaned.

According to the present invention, a workpiece is transported substantially horizontally into a chemical-etch cleaning station from a previous process station. In turn, the workpiece is positioned substantially horizontally within a workpiece receptacle whereby the upper and lower surfaces of the workpiece are exposed. Next, a cleaning solution is discharged into the receptacle thereby immersing the workpiece in the cleaning solution. Also, the cleaning solution is moved about the various surfaces of the workpiece. After an appropriate layer of oxide has been removed from the surfaces of the workpiece, the cleaning solution is withdrawn from the receptacle and a rinse solution is discharged to rinse the cleaning solution from the workpiece surfaces. Finally, the workpiece is transported to another process station.

BRIEF DESCRIPTION OF THE DRAWING FIGURES

The present invention will hereinafter be described in conjunction with the appended drawing figures, wherein like numerals generally denote like elements, and:

FIG. 10A is a top plan view of an embodiment of a chemical-etch cleaning station shown in conjunction with a water track;

FIG. 10B is a side view of the chemical-etch cleaning station shown in FIG. 10A in conjunction with a water track;

FIG. 12A is a side view of a knife-edge support used in the chemical-etch cleaning station shown in FIGS. 11A and 11B;

FIG. 12B is a top plan view of the knife-edge support shown in FIG. 12A;

FIG. 12C is a back view of the knife-edge support shown in FIG. 12A;

DETAILED DESCRIPTION OF PREFERRED EMBODIMENTS OF THE INVENTION

Figure 1:
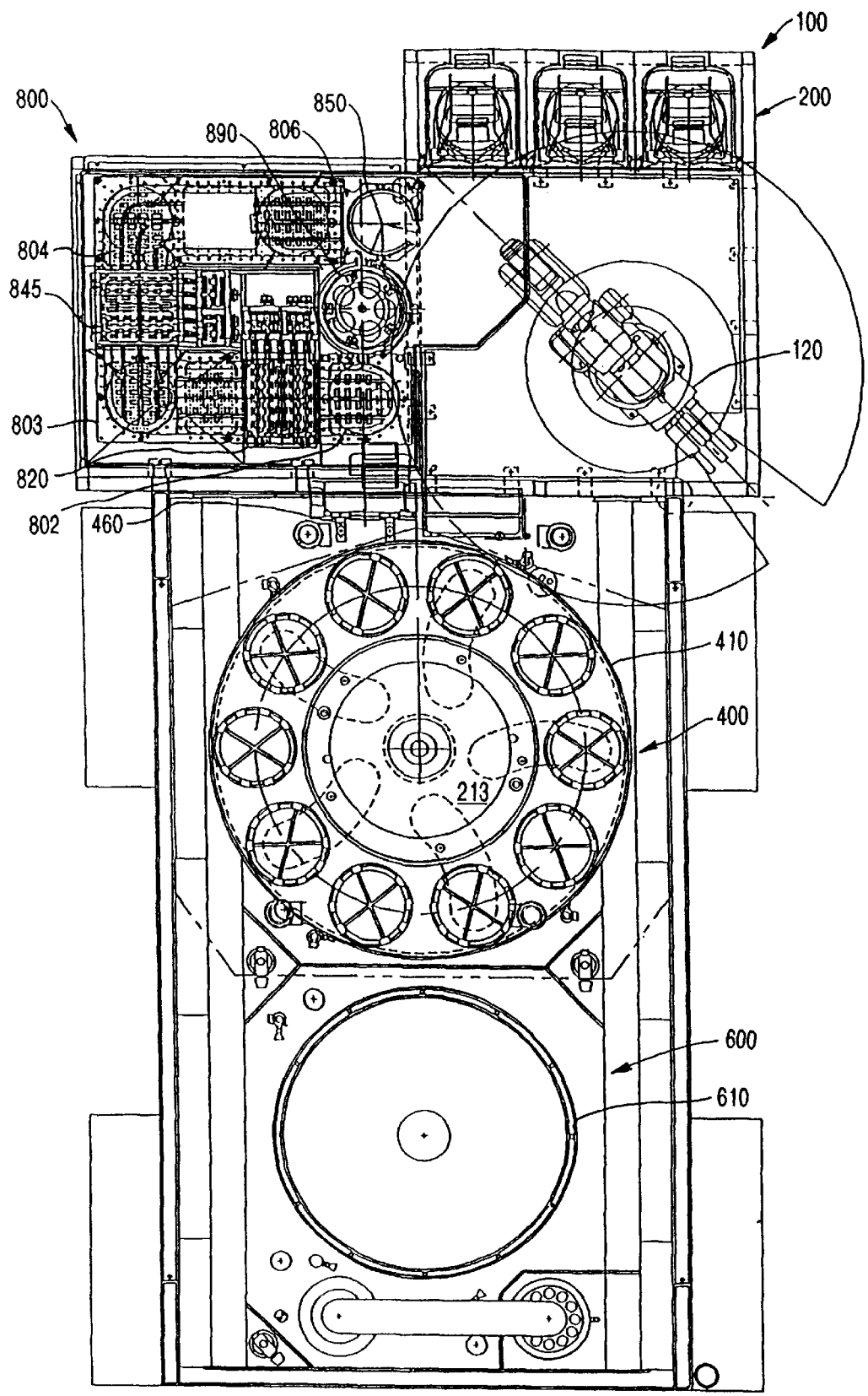
FIG. 1 is a top plan view of an exemplary integrated CMP machine with a post-CMP cleaning station and a chemical-etch cleaning station.
Figure 2:
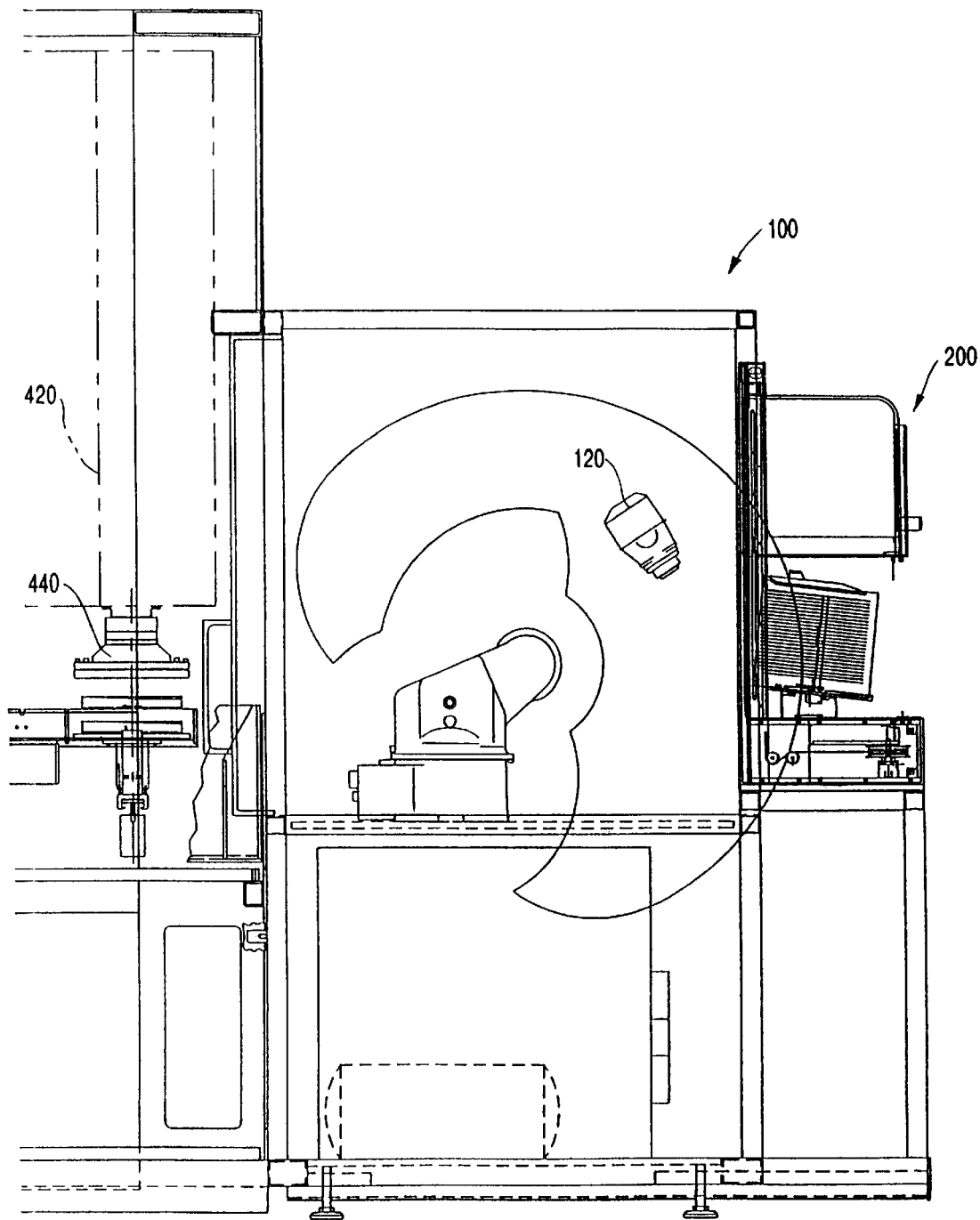
FIG. 2 is a side view of a load/unload station and a portion of an index station employed by the machine shown in FIG. 1.

Referring now to FIGS. 1 and 2, an exemplary integrated Chemical Mechanical Planarization ("CMP") machine 100 is shown. Machine 100 integrates a CMP station with a post-CMP cleaning station and a chemical etch cleaning station, thereby reducing overall processing time, the risk of contaminants drying on the workpieces, and the risk of breakage associated with transporting workpieces between machines. Machine 100 comprises workpiece load/unload station 200, index station 400, CMP station 600, and a cleaning station 800.

Robot arm 120 transports workpieces from load/unload station 200 to index station 400. Robot arm 120 loads five workpieces, one at a time, from load/unload station 200 onto an index table 410 in index station 400. Next, a multi-head transport assembly 420 moves carrier heads 440 into proximity with index table 410 and picks up the five workpieces (FIG. 2). Transport assembly 420 then moves laterally into CMP station 600 and above polishing table 610. Transport assembly 420 then lowers such that the five workpieces are pressed against polishing table 610. To enhance the polishing process, a polishing slurry is preferably provided, and the individual carriers are rotated on and oscillated radially across the polishing surface. The polishing slurry used may be, for example, a water-based slurry comprising colloidal silica particles. In this manner, the surfaces of the workpieces are polished and/or planarized. Although in the above described embodiment five workpieces are planarized at the same time, one skilled in the art quickly will realize that any number of workpieces may be polished at a time without departing from the spirit and scope of the present invention. For a more detailed discussion of the CMP processes, see U.S. patent application Ser. No. 08/926,700, filed Sep. 10, 1997, which is incorporated herein by reference.

Unfortunately, mechanical polishing of the workpieces in conjunction with the use of the polishing slurry may leave scratches and slurry material and other contaminants remaining on the workpieces following the polishing process. These contaminants and scratches may lead to failures or prematurely shortened life spans of devices manufactured from the workpieces. Therefore, the workpieces are cleaned, etched and dried in cleaning station 800.

Accordingly, flipper arm 460 lifts the workpieces out of index station 400 and transports them to cleaning station 800. Cleaning station 800 preferably includes first, second, third and fourth water tracks 802, 803, 804 and 806, scrub stations 820 and 845, chemical-etch cleaning station 850 and spin-dry station 890.

Figure 4:
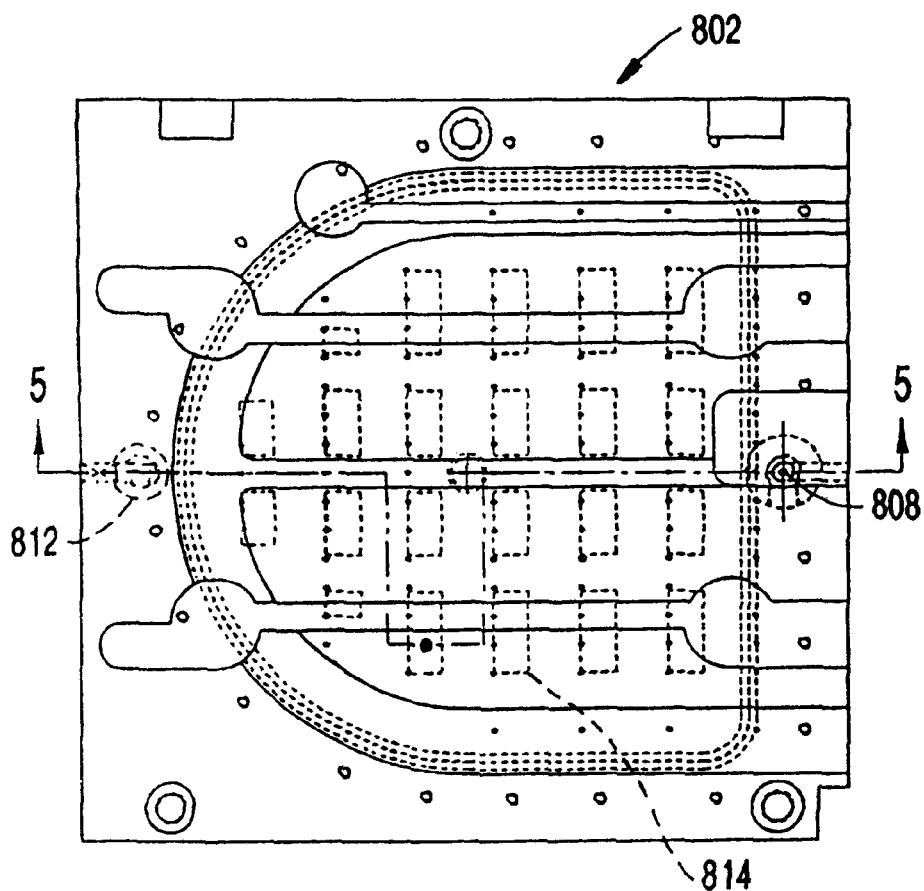
FIG. 4 is a top plan view of a water track employed by the cleaning station shown in FIG. 3A.
Figure 5:
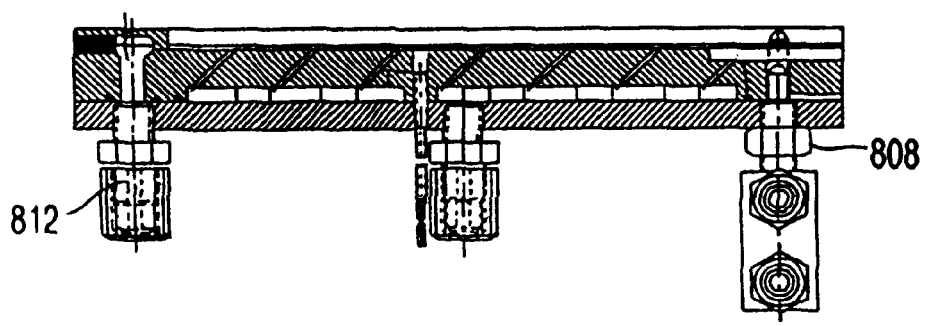
FIG. 5 is a sectional view of the water track taken through lines 5—5 shown in FIG. 4.

In a preferred embodiment of the present invention, each substation within cleaning station 800 (scrub stations 820 and 845, chemical-etch cleaning station 850, and spin-dry station 890) processes one workpiece at a time. Accordingly, a workpiece is loaded onto water track 802 in cleaning station 800 and remains in water track 802 until scrub station 820 is clear to receive the next workpiece. More particularly with reference to FIGS. 4 and 5, track 802 includes staging pin 808 to help maintain the workpiece within the track. When scrub station 820 is clear to receive the workpiece, staging pin 808 lowers. Then, a forward fluid nozzle 812 provides a burst or steady stream of fluid and angled fluid jets 814 help to encourage the workpiece onto scrub station 820. In a similar manner, water track 803 transports the workpiece from scrub station 820 to scrub station 845, and water track 804 with water track 806 transports the workpiece from scrub station 845 to chemical-etch cleaning station 850.

Water tracks 802, 803, 804 and 806 also include a plurality of fluid jets which project fluid upwardly to support the workpieces such that mechanical contact between the workpieces and the water track is substantially eliminated. The use of water tracks 802, 803, 804 and 806 to transport the workpiece between the various stations has the additional advantage of keeping the workpiece wet, thereby preventing contaminants from drying on the workpiece surface. In a preferred embodiment, the fluid used in water tracks 802, 803, 804 and 806 to transport the workpiece includes deionized water.

Figure 6:
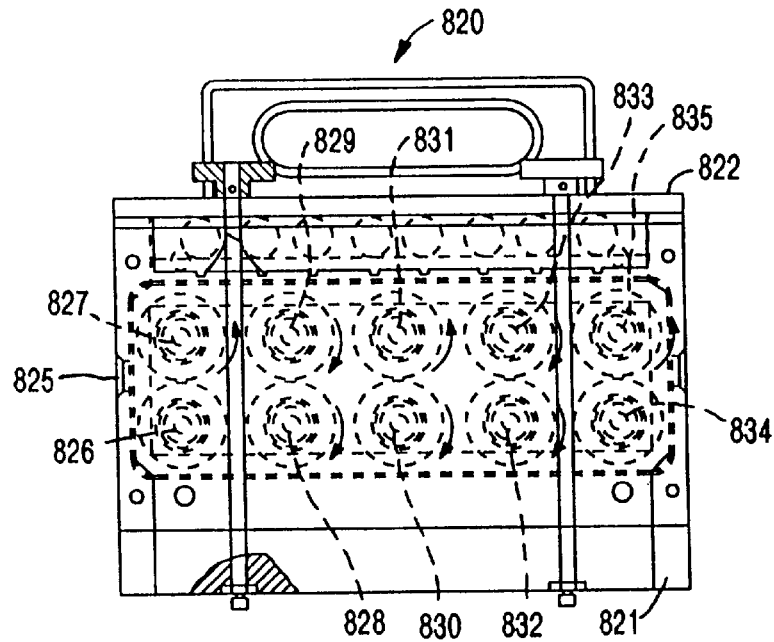
FIG. 6 is a side view of a scrubber station.
Figure 7:
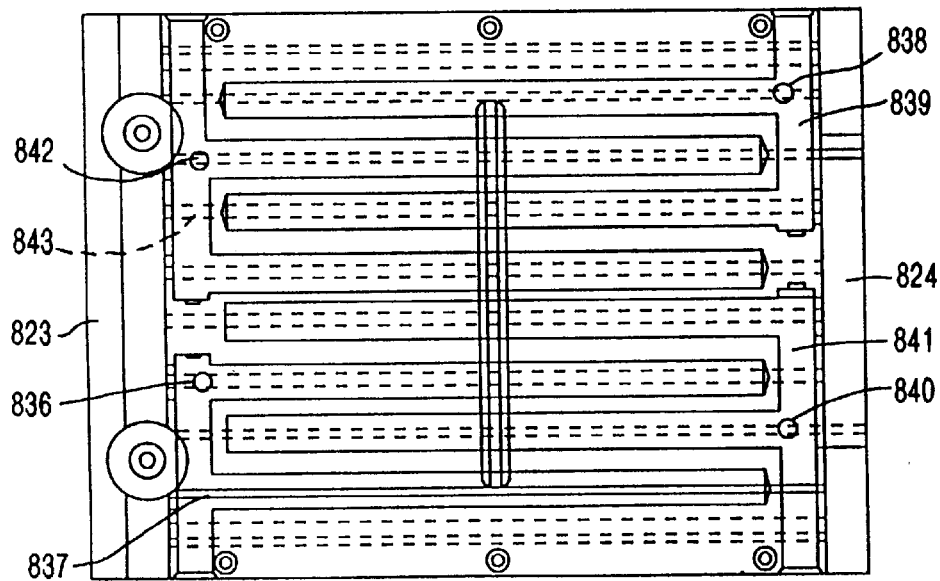
FIG. 7 is a top plan view of the scrubber station shown in FIG. 6.

When scrub station 820 is clear, water track 804 moves the workpiece into scrub station 820 as shown in FIG. 1. Referring now to FIGS. 6 and 7, scrub station 820 includes a plurality of pairs of rollers, a bottom panel 821, a top panel 822, a rear panel 823, and a front panel 824. Commercially available scrub stations such as those manufactured by Wacker Chemtronic company of Germany may be used.

The workpiece enters scrub station 820 at workpiece input 825. A plurality of roller pairs then simultaneously clean the top and bottom surfaces of the workpiece and urge the workpiece through scrub station 820. The bottom rollers (i.e., rollers 826, 828, 830, 832 and 834) rotate clockwise as shown in FIG. 6. Additionally, the top roller of each even roller pair (i.e., rollers 829 and 833) also rotates clockwise as shown in FIG. 6. Finally, the top roller in each odd roller pair (i.e., rollers 827, 831 and 835) rotate counter-clockwise. Consequently, the odd roller pairs (i.e., rollers 826, 827, 830, 831, 834 and 835) urge the workpiece through scrub station 820. The even roller pairs (i.e. rollers 828, 829, 832 and 833) clean the top and bottom surfaces of the workpiece as it moves through scrub station 820. Additionally, the rotation of the brushes may be reversed to maintain the wafer in scrub station 820 until water track 804 is available to receive the workpiece.

Referring now to FIG. 7, top panel 822 comprises one or more fluid inlet ports configured to distribute fluid to a discrete portion of, or to the entirety of, the inside of scrub station 820. Top panel 822 preferably includes a number of manifolds arranged to deliver fluid to specific locations within scrub station 820. In particular, panel 822 comprises a first fluid inlet port 836 that communicates with a first manifold 837 configured to distribute a first fluid proximate a number of rollers within the roller box. First manifold 837 is preferably disposed to release fluid substantially evenly along the length of one or more of the top rollers. Top panel 822 further comprises a second fluid inlet port 838 similarly configured in communication with a second manifold 839 for distributing a second fluid throughout a different portion of the roller box, for example, in the region occupied by the first several roller pairs. Top panel 822 further comprises a third fluid inlet port 840 in communication with a third manifold 841 configured to distribute a third fluid throughout a third region of the roller box, for example, a region proximate the last several roller pairs. Top panel 822 may also include a fourth fluid inlet port 842 that communicates with a fourth manifold 843.

Each individual manifold is configured such that it is fluidly distinct from each of the remaining manifolds. However, one or more of the fluid inlet ports may be coupled together such that a single fluid may be applied to more than one manifold. In the exemplary embodiment shown in FIG. 7, the manifolds are configured to distribute cleaning fluid to locations above and/or between adjacent rollers (the rollers are depicted in phantom lines in FIG. 7).

A plurality of different chemicals (e.g., water, cleaning solutions, surfactants, friction reducing agents, and agents to control the pH of the various solutions) may be applied through the manifolds located on top panel 822. The various fluid inlet ports may be coupled together such that different chemicals may be applied into discrete regions of the roller boxes. In this manner, workpieces passing through a first set of rollers may be exposed to a first chemical solution and later exposed to a second chemical solution in a latter stage of the roller box. For example, the first roller box may distribute a cleaning solution and deionized water mix onto the workpieces to facilitate heavier cleaning, while the second roller box may simply distribute deionized water onto the workpieces to achieve a rinse.

In a preferred embodiment, the workpiece is transported by water track 803 from scrub station 820 to scrub station 845. The workpiece is scrub cleaned in substantially the same manner in scrub station 845 as in scrub station 820. One skilled in the art will realize that scrub station 845 may be removed and the workpiece transported directly from scrub station 820 to chemical-etch cleaning station 850 without departing from the spirit and scope of the present invention.

Regardless of whether the workpiece is scrub cleaned once or twice, the scrub cleaning of workpieces with chemicals such as deionized water may not remove scratches or other surface defects or contaminants which may be implanted within the scratches or other surface defects on the workpiece. In an effort to more effectively remove these contaminants and scratches, HF may be used in conjunction with scrub cleaning. However, the use of HF in conjunction with mechanical scrub cleaning may itself introduce sub-micro scratches on the surfaces of the workpiece, which may trap metal ions and other contaminants. The scrub brushes also may themselves introduce particles during the etching process. As previously stated, contaminants and scratches on the surfaces of the workpiece may lead to failures or prematurely shortened life spans of devices manufactured from the workpiece. Consequently, removal of these contaminants and smoothing of scratches from the surfaces of the workpiece is highly desirable.

When chemical-etch cleaning station 850 is clear, water track 804 transports the workpiece from scrub station 820 into chemical-etch cleaning station 850 as shown in FIG. 1. More particularly with reference to FIGS. 10A and 10B, staging pin 851 lowers when chemical-etch cleaning station 850 is clear to receive the workpiece. Angled fluid jets 853 help to urge the workpiece forward along first water track 804 and onto second water track 806. Similarly, angled fluid jets 854 help to urge the workpiece forward along second water track 806 and into a workpiece receptacle 856. In a preferred embodiment, first water track 804 and second water track 806 are separated by a gap 855 such that fluid used in first water track 804 will not mix with fluid used in second water track 806. Separating first water track 804 and second water track 806 in this manner helps to prevent contaminants from moving into workpiece receptacle 856, reduce dilution of chemicals used in workpiece receptacle 856, and prevent chemicals used in workpiece receptacle 856 from flowing into first water track 804.

Figure 8:
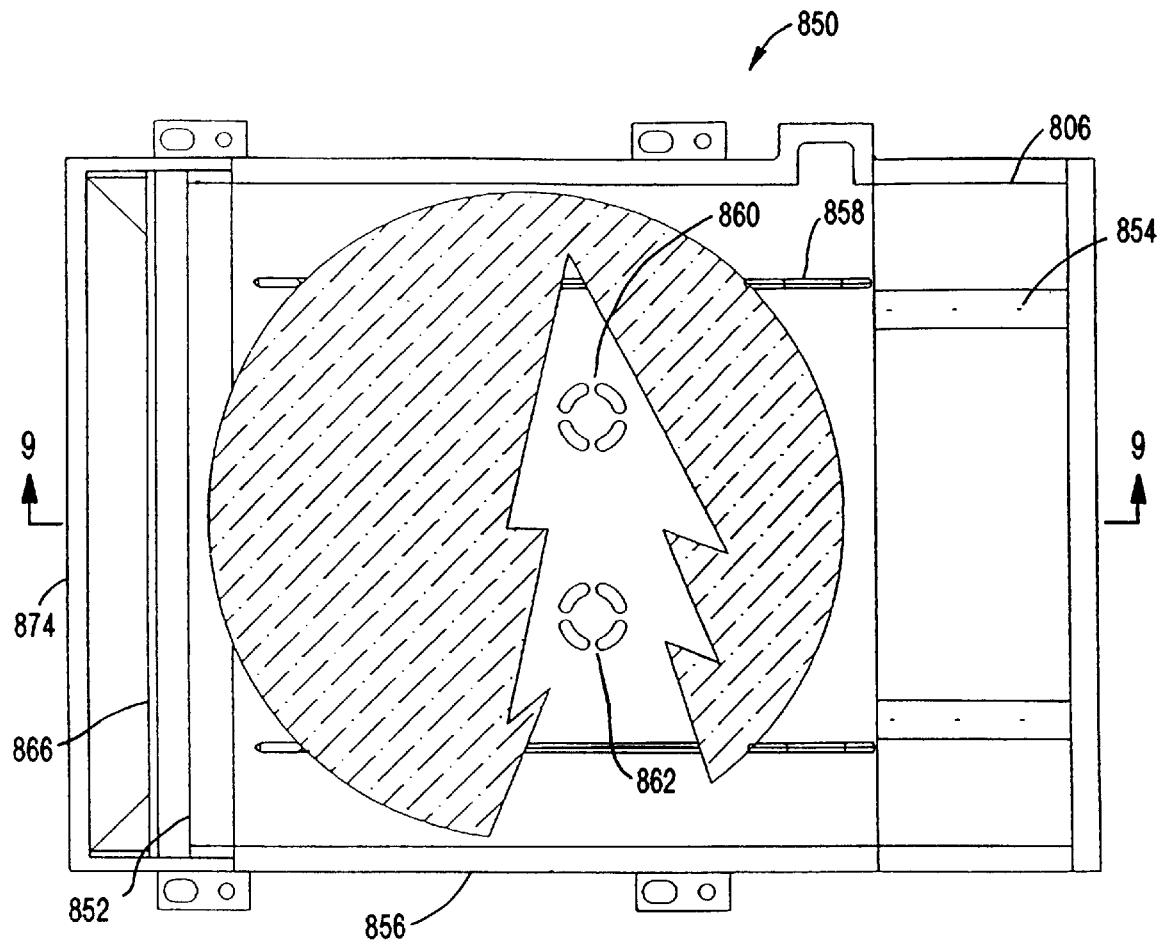
FIG. 8 is a top plan view of a chemical-etch cleaning station.
Figure 9:
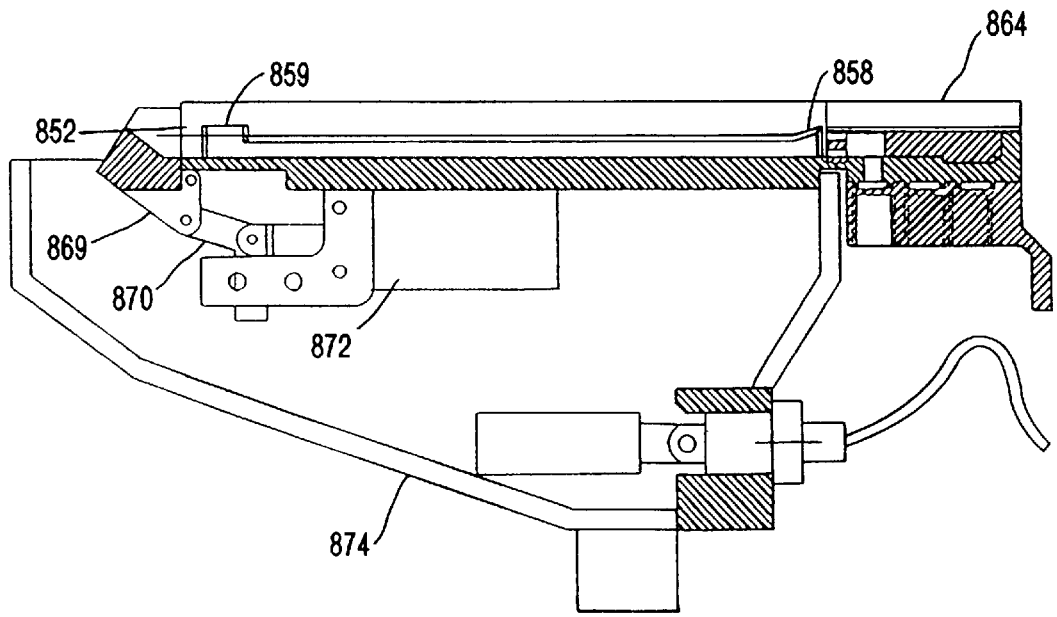
FIG. 9 is a cross sectional view of the chemical-etch cleaning station taken through lines 9—9 shown in FIG. 8.

Referring now to FIGS. 8 and 9, workpiece receptacle 856 preferably includes an opening 852 (FIG. 16) which may be closed by an actuated gate assembly 866. Sump 874 is configured under workpiece receptacle 856 to capture fluid which may overflow or leak from workpiece receptacle 856. Workpiece receptacle 856 and sump 874 are formed from a suitable material which is mechanically strong and resistant to chemicals. In a preferred embodiment, workpiece receptacle 856 and sump 874 are formed from a polyetherimed material, such as the commercial product ULTEM.

Figure 14:
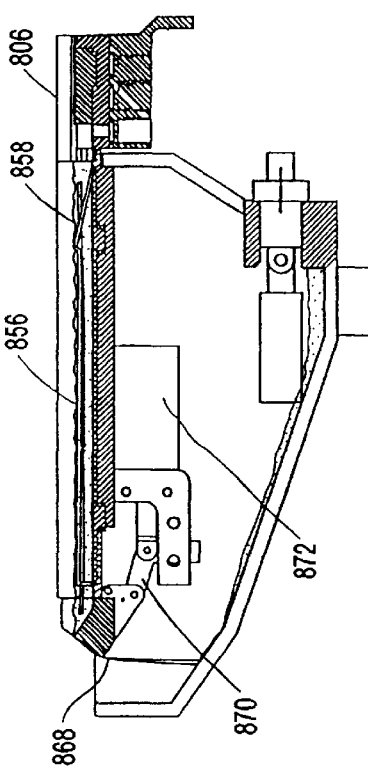
FIGS. 13–15 are cross sectional views of yet another embodiment of a chemical-etch cleaning station.
Figure 13:
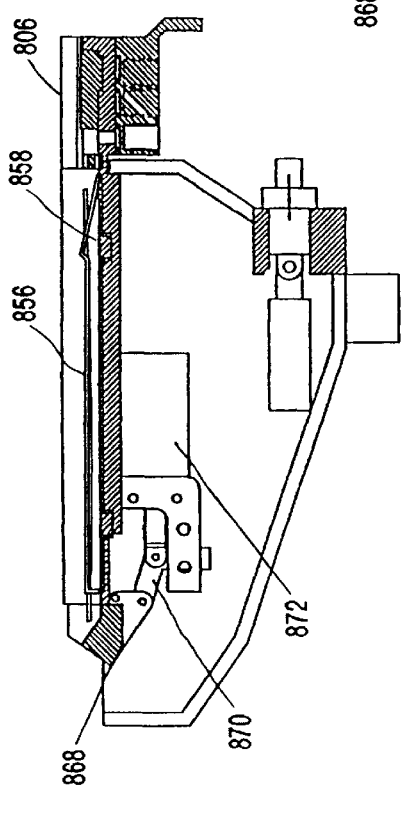
Figure 15:
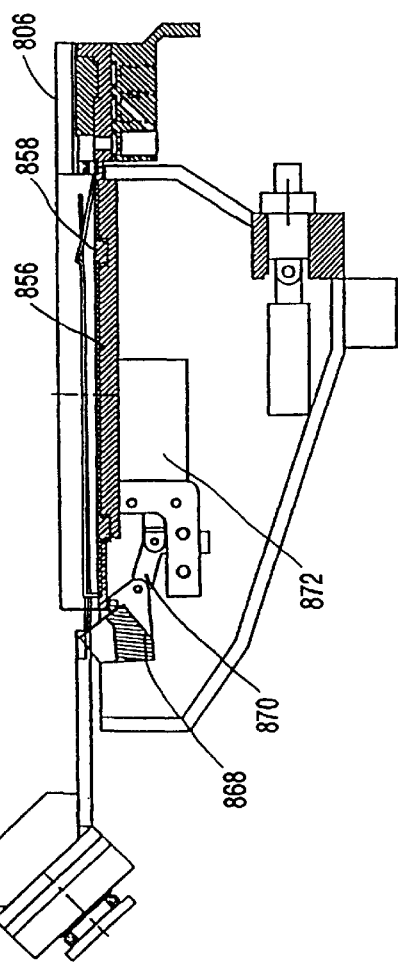

With continued reference to FIGS. 8 and 9, actuated gate assembly 866 preferably includes a dam 868, a link 870, and an actuator 872. Dam 868 is connected to link 870 which in turn is connected to actuator 872. In a preferred embodiment, actuator 872 is an air cylinder, which is well known in the art. One skilled in the art will realize that various other actuators may be used to actuate dam 868. When actuator 872 moves to a first position, dam 868 is raised to a "closed" position as shown in FIG. 13. More particularly, dam 868 appropriately closes opening 852 (FIG. 16) in workpiece receptacle 856 to permit filling of workpiece receptacle 856 with fluid. Dam 868 is sufficiently large such that workpiece receptacle 856 may be filled with fluid to a level sufficient to immerse the workpiece within the fluid. Also, dam 868 is appropriately configured to reduce turbulence as the fluid flows through the workpiece receptacle 856. In a preferred embodiment, dam 868 is sloped when to closed to permit fluid to overflow over dam 868 and into sump 874, thereby reducing turbulence within the fluid flowing in workpiece receptacle 856 as shown in FIG. 14. When actuator 872 moves to a second position, dam 868 is lowered to an "open" position as shown in FIG. 15. More particularly, dam 868 appropriately moves clear of opening 852 (FIG. 16) in workpiece receptacle 856 to permit draining of fluid from workpiece receptacle 856 and to permit access for a robot to transport the workpiece to the next process station. As is particularly depicted in FIG. 15, a robot arm appropriately configured with a wet-end effectuator enters workpiece receptacle 856 to retrieve the workpiece.

Prior to workpiece receptacle 856 receiving a workpiece, actuated gate assembly 866 is closed to facilitate filling of workpiece receptacle 856 with rinse solution. More particularly, fluid port 860 is appropriately configured to distribute a rinse fluid, such as deionized ("DI") water, within workpiece receptacle 856. Accordingly, fluid port 860 is appropriately coupled with a fluid supply system. Various systems for supplying a rinse fluid to a fluid port are well known in the art. For example, fluid port 860 may be coupled with a nozzle attached to a supply tube. In turn, the supply tube is coupled with a main rinse solution supply line. A constant supply pressure is maintained in the main supply line in order to supply a uniform flow of rinse solution within workpiece receptacle 856. DI water is supplied to main supply line by filtering and pumping DI water from a main source. Additionally, first fluid port 860 is configured such that it is fluidly distinct from second fluid port 862, which distributes a cleaning solution such as a hydrogen fluoride ("HF") solution. Similar to first fluid port 860, second fluid port 862 is appropriately coupled with an HF supply system. Fluid port 862 may be coupled with a nozzle attached to a supply tube. In turn, the supply tube is couple with a main HF solution supply line. A programmed concentration of HF is supplied to main HF solution supply line by a dedicated mixer and dispenser. The HF may be supplied to main HF solution supply line from a main source or the HF may be filtered and recirculated. Thus, first fluid port 860 distributes rinse solution within workpiece receptacle 856 in isolation from second fluid port 862.

Figure 16:
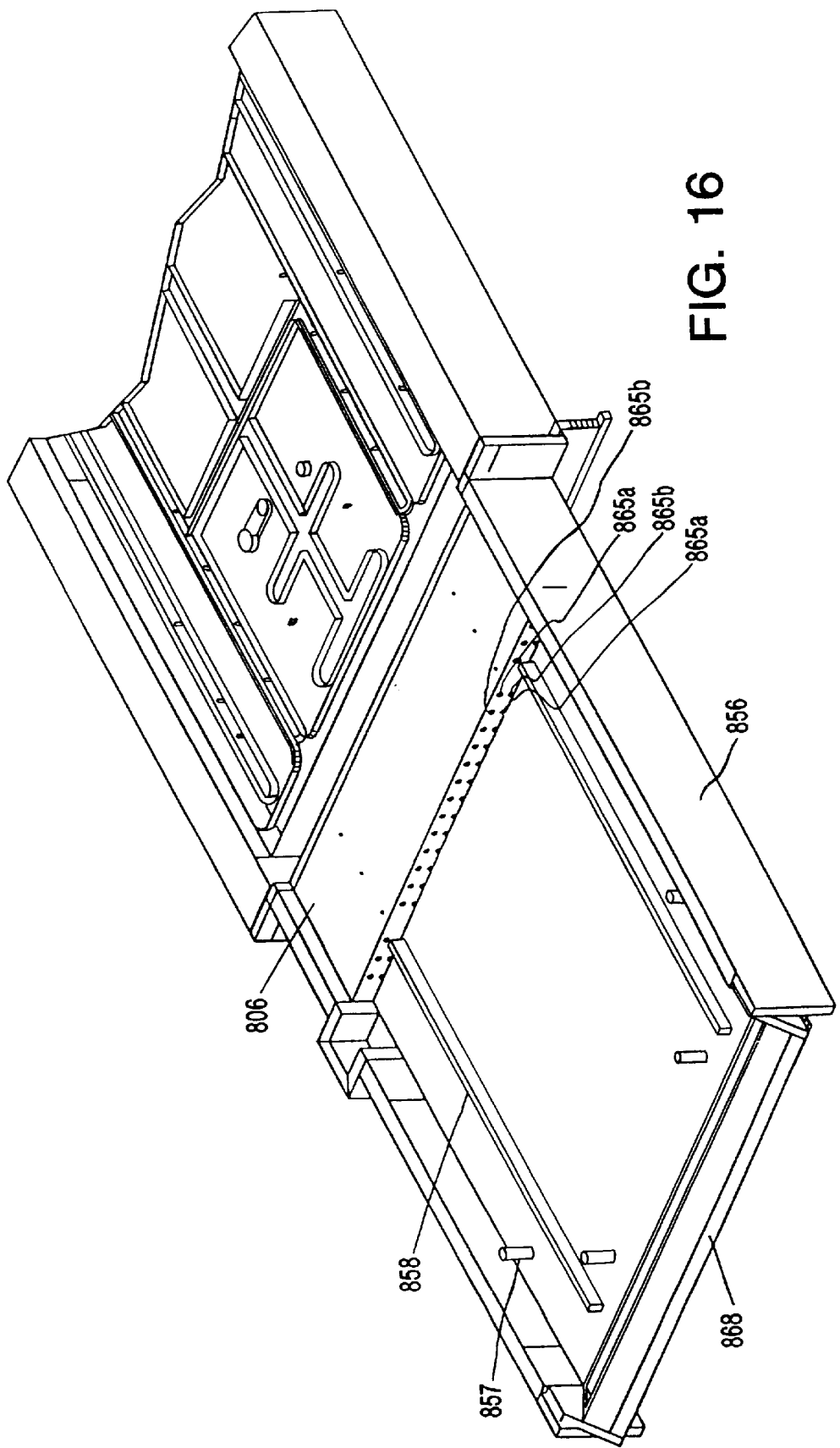
FIG. 16 is a perspective view of a chemical-etch cleaning station.

In addition to first fluid port 860, fluid distribution manifold 864 also distributes rinse fluid within workpiece receptacle 856. Referring now to FIG. 16, fluid distribution manifold 864 includes a plurality of nozzles 865a for distribution of rinse fluid within workpiece receptacle 856. Additionally, plurality of nozzles 865a are configured substantially horizontally to move rinse solution with a substantially laminar flow profile within workpiece receptacle 856. The movement of rinse solution with a substantially laminar flow profile within workpiece receptacle 856 helps to urge the workpiece into receptacle 856 from water track 806. Further, nozzles 865a are appropriately configured such that they are fluidly distinct from nozzles 865b, which are configured to distribute a cleaning solution. Thus, nozzles 865a distribute rinse solution within workpiece receptacle 856 in isolation from nozzles 865b. Also, fluid distribution manifold 864 may be configured within workpiece receptacle 856 in a variety of configurations. For example, fluid distribution manifold 864 may be formed integral to workpiece receptacle 856. Alternatively, fluid distribution manifold 864 may be formed as fittings or nozzles attached to workpiece receptacle 856. Additionally rinse fluid may be supplied to fluid distribution manifold 864 using various fluid supply systems well known in the art. For example, nozzles 865a may be configured to supply rinse solution in the same manner as fluid port 860.

Referring now to FIGS. 10A and 10B, the workpiece is transported by water track 804 to water track 806. Water track 806 urges the workpiece forward into workpiece receptacle 856 which is filled with rinse solution. A water track 807 configured above water track 806 may be employed to help urge the workpiece into workpiece receptacle 856. The workpiece enters the rinse solution in workpiece receptacle 856 at an angle, thereby reducing the amount of air bubbles which may adhere to the surfaces of the workpiece. As the workpiece enters the rinse solution in workpiece receptacle 856, the workpiece contacts a plurality of knife-edge supports 858. More particularly, knife-edge supports 858 are appropriately angled proximate where the workpiece enters workpiece receptacle 856 to assist entry of the workpiece into workpiece receptacle 856. Also, the movement of the rinse solution with a substantially laminar flow profile within receptacle 856 by fluid delivery manifold 864 helps to urge the workpiece along knife-edge support 858. Additionally, in a preferred embodiment, knife-edge supports 858 are formed from a polytetrafluorethylene (PTFE) material, such as the commercial product TEFLON, which reduces the friction between the workpiece and knife-edge supports 858. Thus, the workpiece hydroplanes along knife-edge supports 858 with minimal contact between the workpiece and knife-edge supports 858. Finally, the workpiece contacts vertical portions 859 of knife-edge supports 858 then comes to rest upon knile-edge supports 858 as shown in FIG. 9. Thus, knife-edge supports 858 support the workpiece in a substantially horizontal orientation and expose substantially all of the upper and lower surfaces of the workpiece.

Figure 11A:
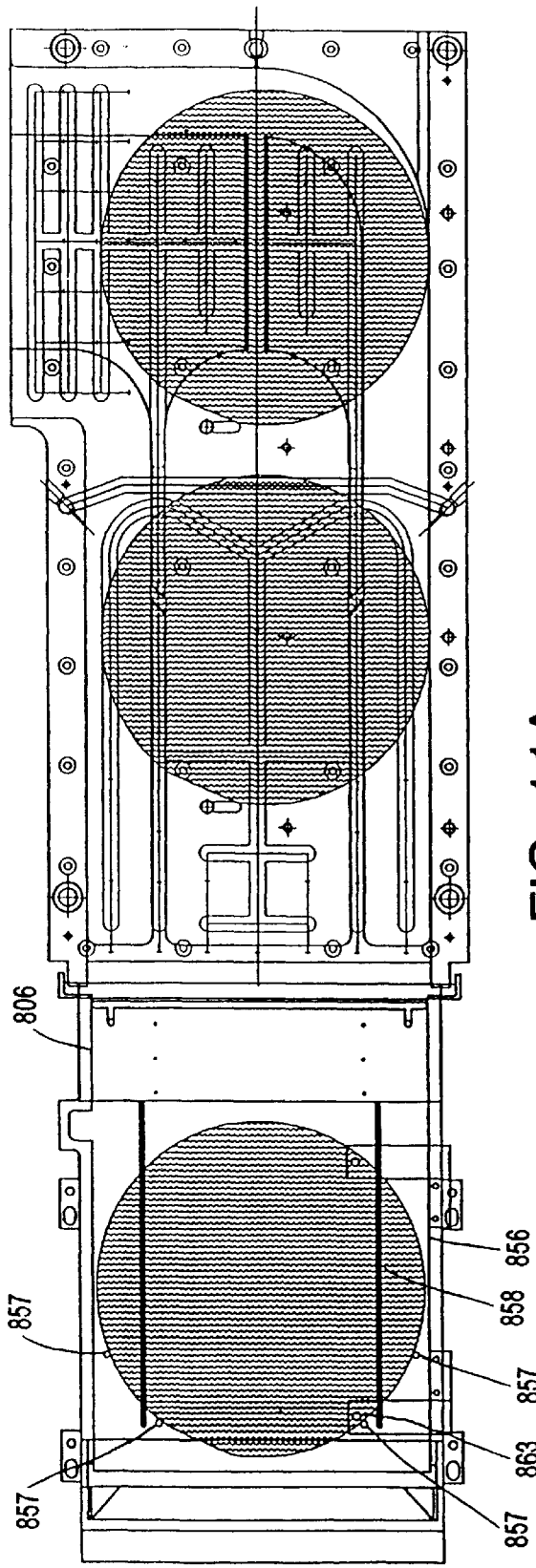
FIG. 11A is a top plan view of another embodiment of a chemical-etch cleaning station shown in conjunction with a water track.
Figure 11B:
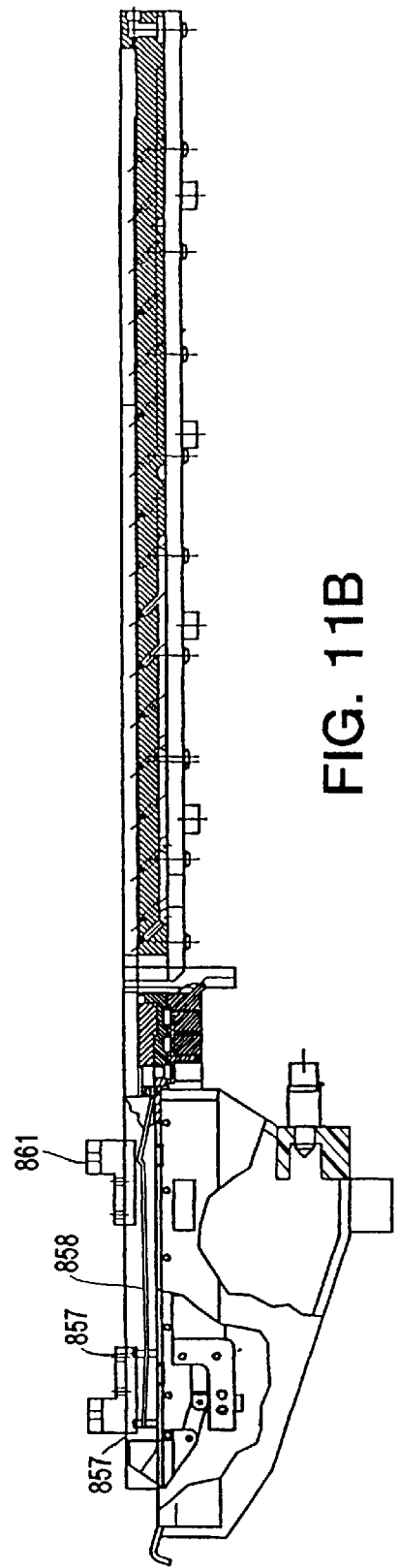
FIG. 11B is a side view of the chemical-etch cleaning station shown in FIG. 11A in conjunction with a water track.

Referring now to FIGS. 11A and 11B, in an alternate embodiment of the present invention, plurality of pins 857 are employed to stop the forward movement of the workpiece when it enters workpiece receptacle 856. Pins 857 are configured such that the edges of the workpiece contacts pins 857 to stop the forward movement of the workpiece when the workpiece enters workpiece receptacle 856. Similarly, pins 857 prevent the workpiece from moving as the fluid within workpiece receptacle 856 is set into motion by fluid delivery manifold 864.

As more particularly shown in FIGS. 12A, 12B and 12C, knife-edge supports 858 are curved to support said workpiece by point contact near the edges of the workpiece, thus increasing the exposed area of the workpiece. Additionally, knife-edge supports 858 are beveled to reduce surface contact with the workpiece. The end of knife-edge supports 858 proximate fluid delivery manifold 864 is tapered as to reduce turbulence when the fluid within workpiece receptacle 856 is set into motion by fluid delivery manifold 864.

A wafer presence sensor is appropriately configured to detect when the workpiece has been positioned within workpiece receptacle 856. In one embodiment, an optical sensor is used. A light emitting device 863 is mounted on bracket 861 and a light receiving device (not shown) is mounted in workpiece receptacle 856 in vertical alignment with light emitting device 863. As shown in FIG. 11A, light emitting device 863 is aligned such that the beam of light transmitting to the light receiving device is broken when the workpiece is appropriately positioned within workpiece receptacle 856. One skilled in the art will realize that various detection devices may be used.

Referring now to FIGS. 8 and 9, when the workpiece has been positioned substantially horizontally within workpiece receptacle 856, actuated gate assembly 866 opens to drain the rinse solution from workpiece receptacle 856. Supporting the workpiece substantially horizontally helps to maintain a film of rinse solution on the surfaces of the workpiece, thereby preventing contaminants from drying on the workpiece surface. Accordingly, workpiece receptacle 856 and knife-edge supports 858 are suitably leveled to ensure that the workpiece will be supported in a substantially horizontal orientation.

Once the rinse fluid has drained from workpiece receptacle 856, actuated gate assembly 866 closes to permit filling of workpiece receptacle 856 with a cleaning solution. More particularly, fluid port 862 is appropriately configured to distribute a cleaning solution, such as hydrogen fluoride ("HF") solution, within workpiece receptacle 856. In addition to fluid port 862, fluid distribution manifold 864 also distributions HF solution within workpiece receptacle 856. Referring now to FIG. 16, fluid distribution manifold 864 is configured with a plurality of nozzles 865b. Nozzles 865b are configured substantially horizontally to move the HF solution with a substantially laminar flow profile within workpiece receptacle 856, specifically near the surfaces of the workpiece. Accordingly, nozzles 865b are configured above and below the plane of the workpiece such that a laminar flow of fluid will flow across the upper and lower surfaces of the workpiece. In a preferred embodiment, the HF solution flows across the upper and lower surfaces of the workpiece with a laminar flow profile, then flows over dam 868 and into sump 874 as shown in FIG. 14. Movement of the HF solution agitates the HF solution such that fresh portions of the HF solution may contact the various surfaces of the workpiece, thereby resulting in a more uniform application of the solution. Moreover, reducing recirculation of the HF solution within workpiece receptacle 856 further insures that fresh portions of the HF solution contact the workpiece. Also, the laminar flow of the HF solution may help to dislodge air bubbles which may adhere to the surfaces of the workpiece, thereby avoiding a pitting effect during the etching process. Additionally, the laminar flow of HF solution may help to dislodge silicon fluoride and water molecules, which formed from the reaction of silicon oxide and HF, from the surfaces of the workpiece. In the context of this invention, laminar flow refers to flow which is characterized by movement of the HF solution in layers. In particular, laminar flow is distinguished from turbulent flow in that in laminar flow there is no macroscopic mixing of adjacent fluid layers.

In a preferred embodiment, a relatively low concentration of HF solution may be used. The concentration of HF solution used may vary from a concentration of 25 parts water to 1 part HF to a concentration of 200 parts water to 1 part HF. The use of a relatively low concentration of HF solution has many advantages. For example, a relatively low concentration of HF solution results in a slower etch rate, which results in more time for the HF solution to disperse thereby resulting in a more uniform etch. A slower etch rate also provides for a greater margin of error in process time from workpiece to workpiece, thereby increasing workpiece to workpiece uniformity. Also, less time will be required to rinse a relatively low concentration of HF from the surfaces of the workpiece. Additionally, working with a low concentration of acid is safer than a high concentration of acid, thereby requiring fewer hazardous chemical handling procedures and devices. However, too low a concentration of HF solution may result in reducing throughput of workpieces in the system. In a most preferred embodiment of the present invention, a concentration of 50 parts water to 1 part HF is used.

The workpiece is immersed in the HF solution for a sufficient length of time to remove an appropriate layer of oxide. The amount of oxide removed may vary from 50 to 100 Å. The rate at which HF removes oxide from the workpiece is a function of (among other factors) the concentration of the HF solution and temperature. A higher concentration of HF solution results in a faster removal rate. Similarly, a higher HF solution temperature results in a faster removal rate. However, a high HF solution temperature may produce HF vapors which may be hazardous. In a most preferred embodiment of the present invention, the workpiece is immersed in a HF solution with a concentration of 50:1 $H_2O$:HF at ambient temperature for approximately 20 seconds to remove approximately 50 Å of oxide from the surfaces of the workpiece, thereby removing contaminants and smoothing micro scratches from the surfaces of the workpiece.

Referring now to FIGS. 8 and 9, actuated gate assembly 866 opens to permit draining of HF solution from workpiece receptacle 856. Actuated gate assembly 866 then closes to permit filling of workpiece receptacle 856 with rinsing fluid. More particularly, a rinse fluid such as deionized ("DI") water is distributed within workpiece receptacle 856 through fluid port 862. Also, DI water is distributed through a plurality of nozzles 865a in fluid distribution manifold 864. Additionally, the rinse solution is moved within workpiece receptacle 856 with a substantially laminar flow profile, particularly near the surfaces of the workpiece. The movement of rinse solution with a substantially laminar flow profile within workpiece receptacle 856 facilitates a more thorough rinse by removing any remaining contaminants from the surfaces of the workpiece.

Next, actuated gate assembly 866 opens to drain rinse solution from workpiece receptacle 856. Then, robot 120 retrieves the rinsed workpiece and removes it from workpiece receptacle 856. When the workpiece has been removed from workpiece receptacle 856, actuated gate assembly 866 closes and workpiece receptacle 856 is filled with rinse solution in preparation for the next workpiece. After retrieving the rinsed workpiece from workpiece receptacle 856, robot 120 transfers it to spin dryer station 890.

Figure 17:
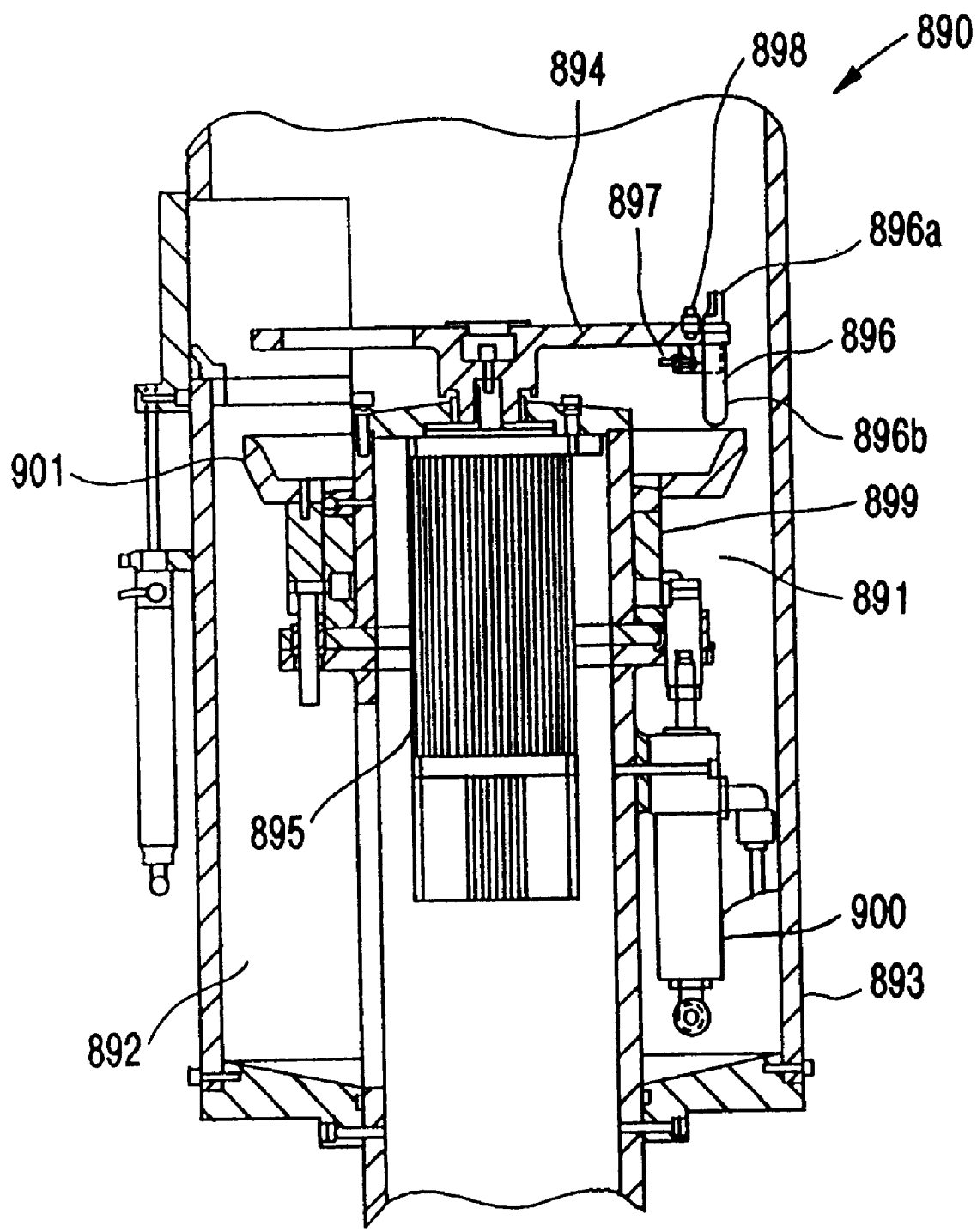
FIG. 17 is a sectional view of a spin dryer station utilized by the cleaning station shown in FIG. 1.

Referring now to FIG. 17, spin dryer station 890 includes a spin dryer 892 enclosed within a chamber 892 defined by a shroud or shield 893. Spin dryer 892 includes a workpiece platform 894 configured to hold a workpiece securely thereon as the platform is spun at high velocities by motor 895. Preferably, a plurality of mass-reducing apertures are formed through platform 894 in order to reduce the mass of spin dryer 892 and thereby minimize spin cycle acceleration and deceleration times.

A plurality of gripping fingers 896 are pivotally mounted around the outer periphery of platform 894 to grasp or grip the edges of a workpiece placed on platform 894 by robot 120. Fingers 896 include a head portion 896a which extends above platform 894 and engages the workpiece, and a shank portion 896b which extends below platform 894. Gripping fingers 896, or at least the portions 896a which contact the workpieces, are made of a soft, pliable material, such as Ertalyte, that will not damage or scratch the held workpieces. Spring-loaded plungers 897 mounted below platform 894 contact bias shank portions 896b radially outwardly, thereby moving head portions 896a radially inwardly, to maintain gripping fingers 896 in a gripping or secured position. Workpieces loaded onto spin dryer 892 do not rest directly on platform 894 but instead rest on support pins 898, which are also made of a soft, pliable material.

Actuator assembly 899 mounted below platform 894 serves to spread the gripping fingers apart and release held workpieces as follows. Assembly 899 is vertically movable by virtue of its attachment to an air cylinder 900. When actuator assembly 899 is moved upwards, cam ring 901 which forms a part of assembly 899 contacts shank portions 896b of gripping fingers 896. As the shank portions slide along the cam surface of cam ring 901, they are forced to pivot radially inwardly which, in turn, causes head portions 896a to pivot radially outwardly to release a workpiece or to provide clearance for a workpiece to be loaded.

Hence, after robot 120 has retrieved a rinsed workpiece from chemical-etch cleaning station 850, it transfers the workpiece onto platform 894 of spin dryer 890. Gripping fingers 896 are held in an open position by actuator assembly 899 until the workpiece has been loaded and properly positioned. After robot 120 moves away, actuator assembly 899 lowers out of contact with shank portions 896b, and plungers 897 again bias gripping fingers 896 towards a closed position to secure the workpiece for spin drying. Platform 894 is accelerated by motor 895 to a velocity of approximately 4,000 rpm in preferably about 1.0 seconds, is spun at that speed for preferably about 20 seconds to remove all water and other particulates from the workpiece surfaces, and is then decelerated back to an idle condition in preferably about 1.0 seconds.

During spinning, the centrifugal forces applied to the workpiece held on platform 894 draws water droplets radially outwardly and of of the workpiece surfaces. To augment this drying process an air flow module may be mounted above shield 893 to direct a column of forced air across the upper workpiece surface.

Once spin drying is complete, actuator assembly 899 is again moved upwardly to engage shank portions 896b and cause gripping, fingers 896 to move to a release position as described above. Assembly 899 is maintained in this position until the dried workpiece has been retrieved by robot 120 and cleared out of spin dryer station 890. Robot 120 then returns the dried workpiece to the slot of the cassette from which the workpiece originated.

Figure 3A:
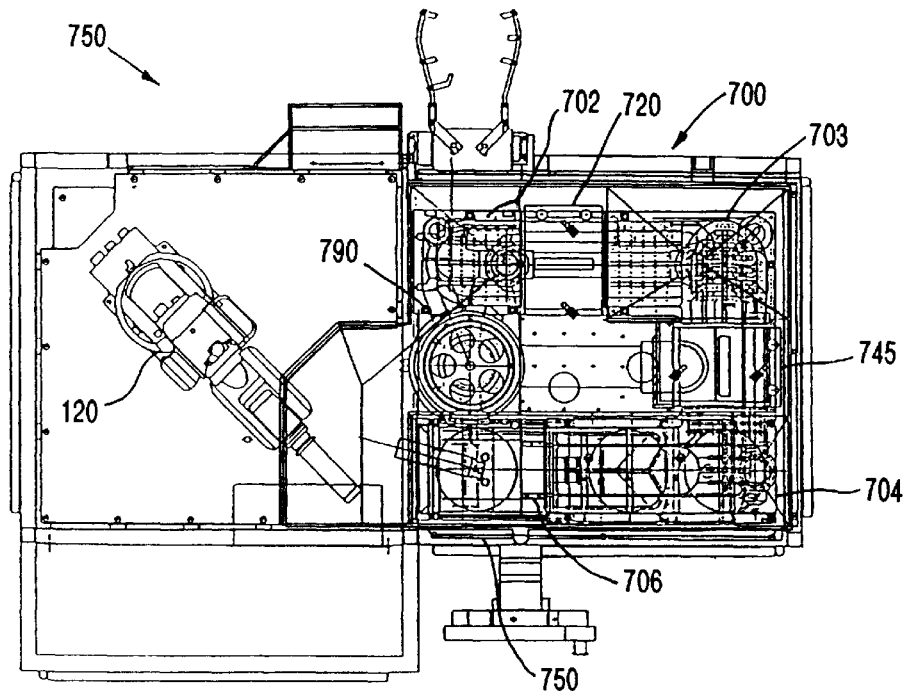
FIG. 3A is a top plan view of another exemplary cleaning machine.
Figure 3B:
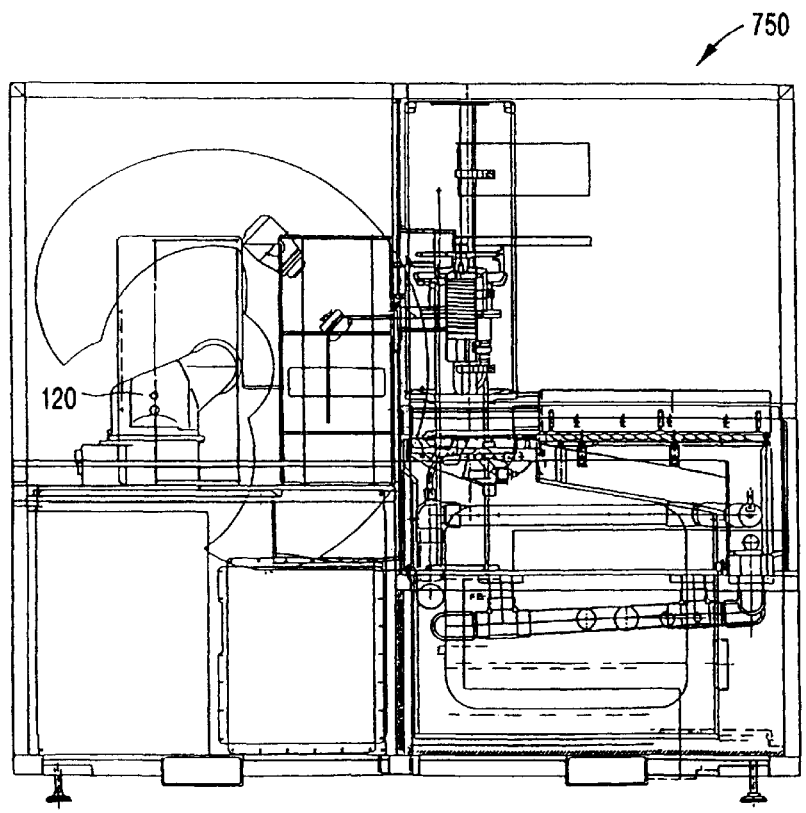
FIG. 3B is a side view of the cleaning machine shown in FIG. 3A.

Although the present invention has been thus far described in conjunction with an integrated CMP machine 100, the present invention may be employed as a separate cleaning machine 750 as shown in FIGS. 3A and 3B. Referring now to FIGS. 3A and 3B, cleaning station 700 preferably includes first second, third and fourth water tracks 702, 703, 704 and 706, scrub stations 720 and 745, chemical-etch cleaning station 750 and spin-dry station 790. In contrast to cleaning station 800 (FIG. 1), in cleaning station 750, robot 120 transports a workpiece into cleaning station 700. Workpieces are scrubbed, chemical-etch cleaned, and spin dried in the same manner as cleaning station 800.

While specific embodiments, including specific process steps, process parameters, solutions, etc. have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described herein.

What is claimed is:

1. A cleaning station for removing contaminants and smoothing micro scratches from workpieces, said cleaning station comprising:

a workpiece receptacle;

support means for supporting a workpiece in a substantially horizontal orientation within said workpiece receptacle, wherein said support means comprise knife-edge supports, wherein said knife-edge supports are configured within said workpiece receptacle to guide the workpiece into said workpiece receptacle and support the workpiece within said workpiece receptacle; and a fluid delivery assembly for delivering a cleaning solution to said workpiece receptacle.

2. A cleaning station in accordance with claim 1 wherein said knife-edge supports are curved to support the workpiece by point contact at the edges of the workpiece.

3. A cleaning station in accordance with claim 1 wherein a portion of said knife-edge supports is tapered to reduce turbulence when said workpiece receptacle is filled with fluid and the fluid is set in motion.

4. A cleaning station in accordance with claim 1 wherein a portion of said knife-edge supports is raised to prevent the movement of the workpiece within said workpiece receptacle.

5. A cleaning station for removing contaminants and smoothing micro scratches from workpieces, said cleaning station comprising:

a workpiece receptacle;

support means for supporting a workpiece in a substantially horizontal orientation within said workpiece receptacle; and a fluid delivery assembly for delivering a cleaning solution to said workpiece receptacle, wherein said fluid delivery assembly comprises a fluid delivery manifold within said workpiece receptacle, and wherein said fluid delivery manifold further comprises a plurality of nozzles configured to move fluids within said workpiece receptacle such that said fluids flow with a substantially laminar flow profile proximate said workpiece.

6. A cleaning station in accordance with claim 5 wherein said plurality of nozzles are configured to deliver fluids to said workpiece receptacle in a substantially horizontal direction.

7. A cleaning station in accordance with claim 5 wherein said plurality of nozzles comprise a first set of nozzles for delivering said cleaning solution and a second set of nozzles for delivering a rinse solution, wherein said first and second sets of nozzles are fluidly separated from one another such that said cleaning solution and said rinse solution are delivered to said workpiece receptacle in an isolated manner.

8. A cleaning station for removing contaminants and smoothing micro scratches from workpieces, said cleaning station comprising:

a workpiece receptacle having an opening formed therein and an actuated gate assembly operatively coupled to said workpiece receptacle, wherein said gate assembly includes:

a dam;

a link member having a first end connected to said dam and a second end; and an actuator connected to said second end of said link member, wherein said dam closes said opening in response to movement by said actuator;

a plurality of support members configured to support a workpiece in a substantially horizontal orientation within said workpiece receptacle; and a fluid delivery assembly for delivering a cleaning solution to said workpiece receptacle.

9. A cleaning station in accordance with claim 8 wherein said actuator translates between a first position, such that said dam closes said opening to facilitate filling of said workpiece receptacle with said cleaning solution, and a second position, such that said dam opens to facilitate draining of said cleaning solution from said workpiece receptacle.

10. A cleaning station in accordance with claim 8 wherein said dam and said workpiece receptacle are sized to facilitate filling of said workpiece receptacle with said cleaning solution to substantially immerse said workpiece.

11. A cleaning station in accordance with claim 10 wherein said dam is sloped to reduce turbulence when said workpiece receptacle is filled with said cleaning solution.

12. A cleaning station for removing contaminants and smoothing micro scratches from workpieces, said cleaning station comprising:

a workpiece receptacle;

a plurality of support members configured to support a workpiece in a substantially horizontal orientation within said workpiece receptacle;

a fluid delivery assembly, for exposing said workpiece to a cleaning solution and for moving said cleaning solution within said workpiece receptacle such that said cleaning solution flows with a substantially laminar flow profile proximate said workpiece;

a water track for transporting said workpiece to said workpiece receptacle wherein said water track comprises a primary water track for transporting said workpiece from a prior process station and a secondary water track for urging said workpiece into said workpiece receptacle, wherein said primary and secondary water tracks are separated by a gap and fluidly isolated.

13. A cleaning station for removing contaminants and smoothing micro scratches from workpieces, said cleaning station comprising:

a water track configured to transport a workpiece from a prior processing station wherein said water track is configured to transport the workpiece in a substantially horizontal orientation;

a workpiece receptacle wherein said workpiece receptacle further comprises an opening formed therein and an actuated gate assembly, wherein said actuated gate assembly closes said opening to facilitate filling of said workpiece receptacle with fluid and opens to permit draining of fluid from said workpiece receptacle;

a plurality of support members configured to support a workpiece in a substantially horizontal orientation within said workpiece receptacle; and a fluid delivery system for exposing said workpiece to a hydrogen fluoride ("HF") solution within said workpiece receptacle.

* * * * *